(12) United States Patent
Watanabe (10) Patent No.: US 7,939,878 B2
(45) Date of Patent: May 10, 2011

(54) NONVOLATILE SEMICONDUCTOR MEMORY AND METHOD OF MANUFACTURING THE SAME AND MANUFACTURING METHOD THEREOF (75) Inventor: Hiroshi Watanabe, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 714 days.

(21) Appl. No.: 11/853,505

(22) Filed: Sep. 11, 2007

(65) Prior Publication Data
US 2008/0061350 A1  Mar. 13, 2008

(30) Foreign Application Priority Data
Sep. 12, 2006 (JP) .................. 2006-247151

(51) Int. Cl.
H01L 29/788 (2006.01)
(52) U.S. Cl. .............. 257/315; 257/E27.103; 257/E29.3
(58) Field of Classification Search ................... 257/315, 257/E29.3, E27.103
See application file for complete search history.

(56) References Cited

U.S. PATENT DOCUMENTS

| 5,889,304 | A | 3/1999 | Watanabe et al. |
| 6,057,580 | A | 5/2000 | Watanabe et al. |
| 7,091,091 | B2 * | 8/2006 | Ding .......................... 438/265 |
| 7,109,549 | B2 | 9/2006 | Ozawa |
| 2003/0030089 | A1 * | 2/2003 | Sumino et al. ............... 257/298 |
| 2004/0238881 | A1 | 12/2004 | Ozawa |
| 2006/0140028 | A1 | 6/2006 | Mizushima et al. |

FOREIGN PATENT DOCUMENTS
JP  2006-186073  7/2006
* cited by examiner

Primary Examiner — David S Blum
(74) Attorney, Agent, or Firm — Oblon, Spivak, McClelland, Maier & Neustadt, L.L.P.

(57) ABSTRACT

There is provided a nonvolatile semiconductor memory of an aspect of the present invention includes a semiconductor substrate, first and second isolation insulating layers provided in the semiconductor substrate, a channel region between the first and second isolation insulating layers, a gate insulating film on the channel region, a floating gate electrode on the gate insulating film, an inter-gate insulating film on the floating gate electrode, and a control gate electrode on the inter-gate insulating film, wherein the isolation insulating layer is made up of a thermal oxide film provided on a bottom surface and a side surface of a concave portion of the semiconductor substrate and an insulating film which is provided on the thermal oxide film and fills the concave portion, and a dimension of the floating gate electrode in a channel width direction is more than a dimension of the channel width.

19 Claims, 5 Drawing Sheets

Channel width direction

FIG. 4

F I G. 5      Channel width direction

F I G. 6      Channel width direction

F I G. 7      Channel width direction

F I G. 1 1   Channel width direction

F I G. 1 2   Channel width direction

F I G. 1 3   Channel width direction

NONVOLATILE SEMICONDUCTOR MEMORY AND METHOD OF MANUFACTURING THE SAME AND MANUFACTURING METHOD THEREOF

CROSS-REFERENCE TO RELATED APPLICATIONS

This application is based upon and claims the benefit of priority from prior Japanese Patent Application No. 2006-247151, filed Sep. 12, 2006, the entire contents of which are incorporated herein by reference.

BACKGROUND OF THE INVENTION

1. Field of the Invention

The present invention relates to a nonvolatile semiconductor memory and a manufacturing method thereof.

2. Description of the Related Art

As a nonvolatile semiconductor memory mounted on an electronic device, for example, a NAND- or NOR-type flash memory is extensively used.

In order to improve characteristics of a memory cell transistor constituting the flash memory, elements having various kinds of structures and a manufacturing method of obtaining such elements (see, e.g., JP-A 2006-186073 [KOKAI]) have been proposed, and miniaturization of the memory cell transistor has advanced for a reduction in size and integration in recent years.

However, when miniaturization of the memory cell transistor advances, physical effects which are not a problem in a conventional technology tend to become obvious, which is a factor of degradation in characteristics and a reduction in reliability of the memory cell transistor.

As one of such degradation, there is degradation in characteristics due to a structure of the memory cell transistor at a channel end.

When a floating gate electrode is formed in an active region after an isolation insulating layer is formed in an element isolating region, a gate end of the floating gate electrode in a channel width direction sags toward a semiconductor substrate side. Therefore, this sag causes a parasitic transistor effect at the gate end to become prominent, and kink characteristic occurs due to this effect.

Further, when the floating gate electrode sags, a gate insulating film (a tunnel oxide film) has a structure with a convex shape with respect to the floating gate electrode.

Therefore, an FN tunneling current in a writing/erasing operation is concentrated on the gate end, thereby provoking degradation in the gate insulating film (the tunnel oxide film).

On the other hand, in case of depositing a floating gate material on the gate insulating film (the tunnel oxide film) and then forming the floating gate electrode and an element isolation trench in a self-alignment manner, a side surface of a floating gate in the channel width direction and a side surface of a silicon substrate in a channel section are oxidized by a later-performed oxidizing step, and a dimension of the floating gate electrode in the width direction becomes smaller than a channel width because an oxidizing rate of the silicon substrate is lower than an oxidizing rate of the floating gate electrode consisted of polysilicon.

Therefore, an electric field at the channel end is weakened, and hence a parasitic transistor occurs at the channel end, thus degrading characteristics of the memory cell transistor.

Further, in a manufacturing method of this floating gate electrode, a control gate electrode is configured to cover the side surface of the floating gate electrode through an inter-gate insulating film in order to improve a coupling ratio of the memory cell transistor. Therefore, the control gate electrode is placed closer to the gate insulating film (the tunnel oxide film).

Accordingly, a potential at the control gate electrode affects an electric field at the channel end, thereby degrading characteristics of the memory cell transistor.

BRIEF SUMMARY OF THE INVENTION

A nonvolatile semiconductor memory of an aspect of the present invention comprising: a semiconductor substrate; first and second isolation insulating layers provided in the semiconductor substrate; a channel region between the first and second isolation insulating layers; a gate insulating film on the channel region; a floating gate electrode on the gate insulating film; an inter-gate insulating film on the floating gate electrode; and a control gate electrode on the inter-gate insulating film, wherein the isolation insulating layer is made up of a thermal oxide film provided on a bottom surface and a side surface of a concave portion of the semiconductor substrate and an insulating film which is provided on the thermal oxide film and fills the concave portion, and a dimension of the floating gate electrode in a channel width direction is more than a dimension of the channel width.

A method of manufacturing a nonvolatile semiconductor memory of an aspect of the present invention comprising: forming a gate insulating film formed on a surface of a semiconductor substrate; forming a floating gate electrode on the gate insulating film; forming an anti-oxidation film on a side surface of the floating gate electrode in a channel width direction; using the floating gate electrode as a mask to form a concave portion in the semiconductor substrate; forming a thermal oxide film on a bottom surface and a side surface of the concave portion based on thermal oxidation; forming an insulating film on the thermal oxide film to fill the concave portion; forming an inter-gate insulating film on the floating gate electrode; and forming a control gate electrode on the inter-gate insulating film.

DETAILED DESCRIPTION OF THE INVENTION

1. Outline

In an example of the present invention, a dimension of a floating gate electrode in a width direction is more than a channel width of a channel region in a cross-sectional structure of a memory cell transistor in a channel width direction. Further, an end of the floating gate electrode does not sag toward a semiconductor substrate side, and a lower surface of the floating gate electrode is flat with respect to an upper surface of the channel region opposed thereto. Furthermore, a control gate electrode of the memory cell transistor is apart from the channel region in a self-alignment manner.

Therefore, degradation in characteristics of the memory cell transistor due to a parasitic element at a channel end can be suppressed.

In order to obtain this structure, a thermal oxide film obtained by thermally diffusing an oxidant is formed on a side surface of the semiconductor substrate which serves as the channel region in the channel width direction.

As a manufacturing method of this structure, an anti-oxidation film is formed on a side surface of the floating gate electrode in the channel width direction, and then an element isolation trench is formed in the semiconductor substrate. As a result, a side surface of a polysilicon film constituting the floating gate electrode is covered with the anti-oxidation film, and silicon is exposed on a bottom surface and a side surface of the semiconductor substrate serving as the channel region. Subsequently, thermal oxidation is carried out with respect to the entire surface of the substrate.

The thermal oxide film is not formed on the side surface of the floating gate electrode in the channel width direction because of the anti-oxidation film. On the other hand, in the semiconductor substrate serving as the channel region, the oxidant is diffused from the exposed surface of the semiconductor substrate toward the inside, and the thermal oxide film is formed to extend from the surface of the semiconductor substrate to the inside. Therefore, the channel width becomes narrower due to formation of the thermal oxide film.

Accordingly, when processing to limit a dimension of the channel width of the floating gate electrode is carried out and then thermal oxidation to reduce a dimension of the channel width is performed, the dimension of the floating gate electrode in the channel width direction can be increased beyond the dimension of the channel width, and the end of the floating gate electrode does not sag toward the semiconductor substrate side, thereby fabricating the memory cell transistor having a structure where the lower surface of the floating gate electrode is flat with respect to the upper surface of the channel region opposed thereto.

Therefore, degradation in characteristics of the memory cell transistor due to a parasitic element at the channel end can be suppressed.

2. Embodiment (1) Embodiment (a) Structure

FIGS. 1 to 4 show a structure of a memory cell transistor according to an embodiment of the present invention.

Figure 1:
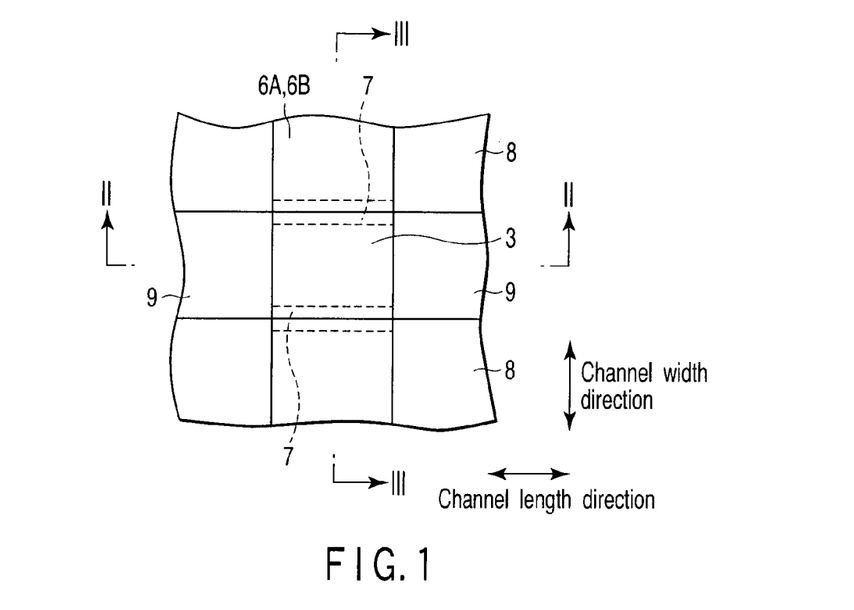
FIG. 1 is a plan view showing a structure of a memory cell transistor according to an embodiment of the present invention.

FIG. 1 is a plan view of a memory cell transistor according to this embodiment.

Figure 2:
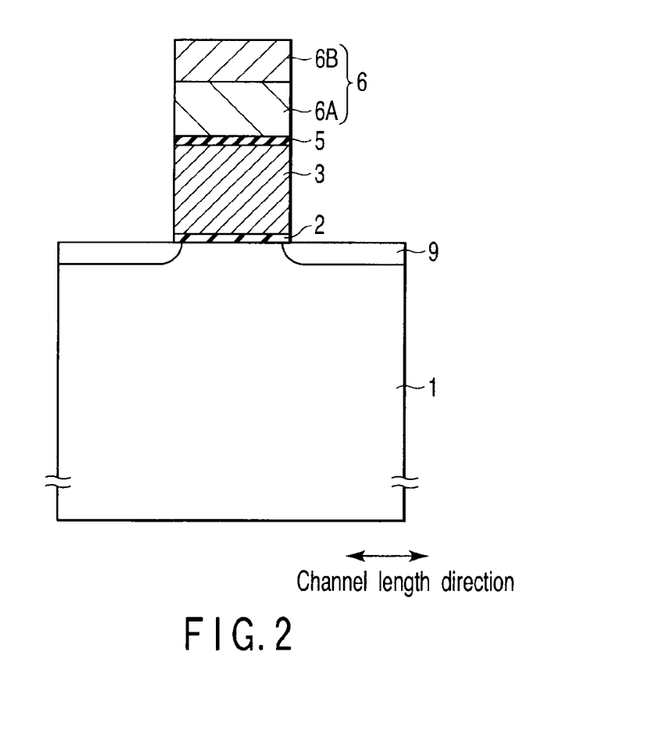
FIG. 2 is a cross-sectional view taken along a line II-II in FIG. 1.
Figure 3:
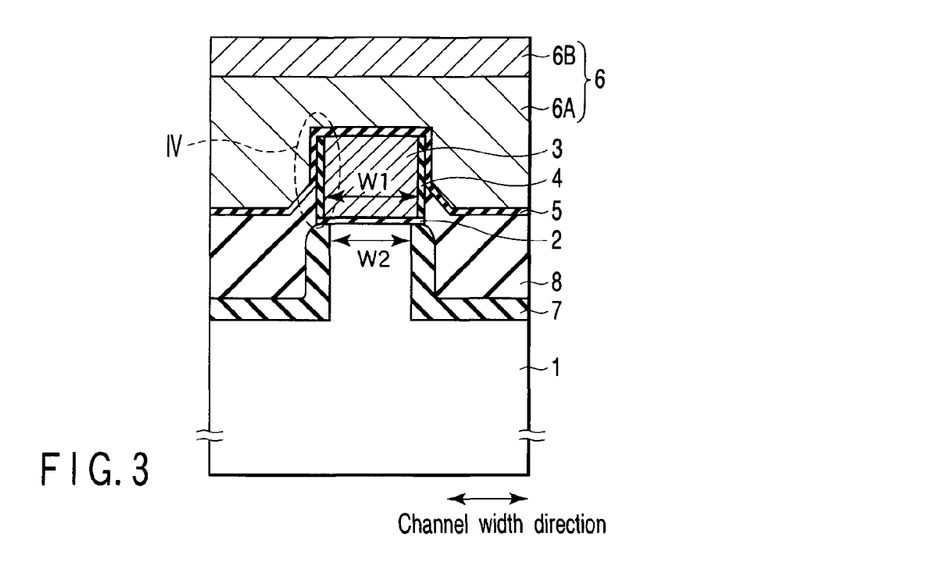
FIG. 3 is a cross-sectional view taken along a line III-III in FIG. 1.

FIG. 2 is a view showing a cross section taken along a line II-II in FIG. 1, and depicts a cross section of the memory cell transistor in a channel length direction. Additionally, FIG. 3 is a view showing a cross section taken along a line III-III in FIG. 1, and depicts a cross section in the channel width direction.

A surface region of a semiconductor substrate is constituted of an element isolating region and an active region which is surrounded by the element isolating region and has an element formed therein. This semiconductor substrate 1 is, e.g., a silicon substrate.

An insulating film 8 having, e.g., a shallow trench isolation (STI) structure (to be referred to as an STI insulating film hereinafter) is formed in the element isolating region. The insulating film 8 is formed of, e.g., a silicon oxide film.

Further, the memory cell transistor having a stacked gate structure including a floating gate electrode 3 and a control gate electrode 6 is formed in the active region.

The floating gate electrode 3 is formed on a gate insulating film (a tunnel oxide film) 2 formed in the active region.

An SiN film 4 serving as an anti-oxidation film is formed on a side surface of the floating gate electrode 3 in the channel width direction. Furthermore, an upper surface and a side surface in the channel width direction of the floating gate electrode 3 are covered with an inter-gate insulating film 5. Therefore, the side surface of the floating gate electrode 3 is covered with the inter-gate insulating film 5 through the silicon nitride film (SiN) film 4.

The control gate electrode 6 has a two-layer structure including a polysilicon film 6A and a silicide film 6B made of, e.g., WSi, NiSi, or MoSi. This control gate electrode 6 functions as a word line.

It is to be noted that the present invention is not restricted to the control gate electrode having the two-layer structure including the polysilicon film 6A and the silicide film 6B, and a control gate electrode having a single-layer structure including the polysilicon film 6A alone may be adopted.

Moreover, a diffusion layer 9 is formed in the semiconductor substrate 1 as a source/drain region of the memory cell transistor.

In addition to the gate structure of the memory cell transistor, a thermal oxide film 7 (e.g., a silicon oxide film) is formed on a side surface of the semiconductor substrate 1 in the channel width direction serving as the channel region. Therefore, the thermal oxide film 7 and the STI insulating film 8 are formed in an element isolation trench formed in the semiconductor substrate 1. In this embodiment, the thermal oxide film 7 and the STI insulating film 8 function as an isolation insulating layer.

The thermal oxide film 7 is formed by forming the anti-oxidation film 4 on the side surface of the floating gate electrode 3 in the channel width direction, forming the element isolation trench to expose the side surface of the semiconductor substrate 1 serving as the channel region in the channel width direction, and then diffusing the oxidant in the semiconductor substrate 1 with respect to the exposed surface based on the thermal oxidation step.

At the time of thermal diffusion of the oxidant, the side surface of the floating gate electrode 3 in the channel width direction is covered with the anti-oxidation film 4, and diffusion of the oxidant into the polysilicon film constituting the floating gate electrode 3 does not occur. Moreover, since the top face of the floating gate electrode 3 is covered with a mask material in gate processing, diffusion of the oxidant from the top face of the floating gate electrode 3 does not occur either.

Therefore, when the thermal oxide film 7 is formed on the side surface of the semiconductor substrate 1 based on diffusion of the oxidant, the channel region recedes in the channel width direction as compared with the floating gate electrode 3.

Accordingly, like the cross section in the channel width direction depicted in FIG. 3, a dimension W1 of the floating gate electrode 3 in the channel width direction is larger than a dimension W2 of the channel width.

Figure 4:
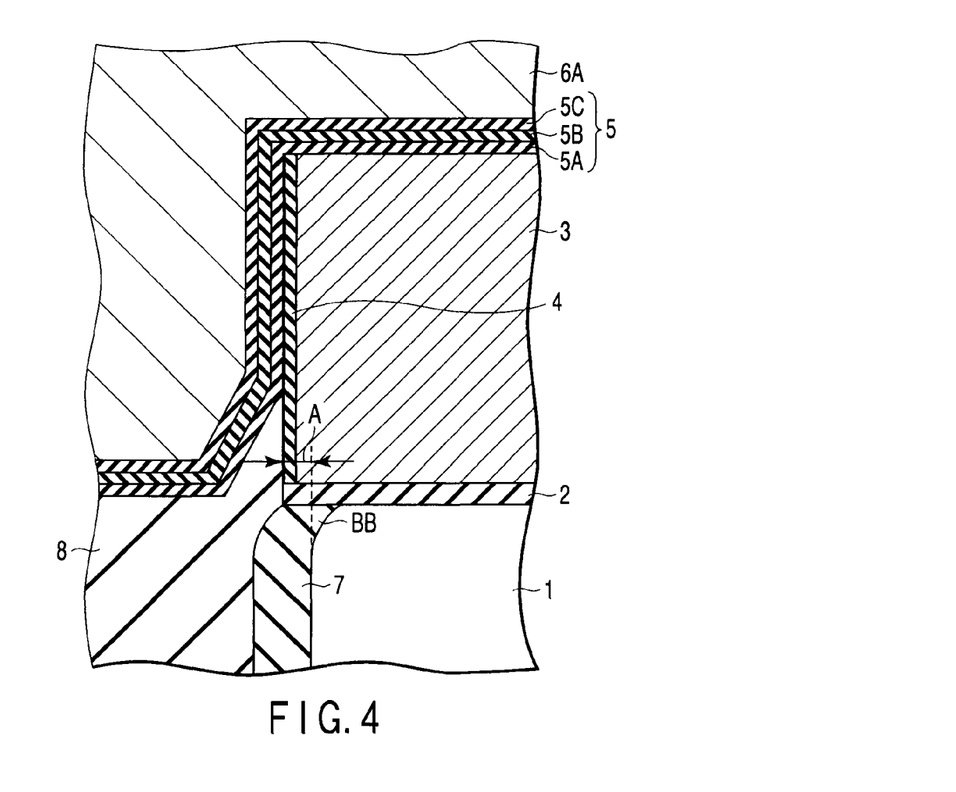
FIG. 4 is an enlarged view of a part IV depicted in FIG. 3.

FIG. 4 is an enlarged view of a part IV (the side surface of the floating gate electrode 3) depicted in FIG. 3. In this embodiment, as the inter-gate insulating film 5, a three-layer structure including a silicon oxide ($SiO_2$) film 5A, an SiN film 5B, and an $SiO_2$ film 5C, which is a so-called ONO film is used.

As shown in FIG. 4, the $SiO_2$ film 5A is formed on the SiN film 4 as the anti-oxidation film on the side surface of the floating gate electrode 3. Therefore, since the side surface of the floating gate electrode 3 is covered with the inter-gate insulating film 5 via the SiN film 4, it is substantially covered with an NONO film having a four-layer structure including the anti-oxidation film 4 and the inter-gate insulating film 5. On the other hand, the top face of the floating gate electrode 3 is covered with the ONO film as the inter-gate insulating film 5 alone.

It is to be noted that the inter-gate insulating film 5 is not restricted to the ONO film, and it may be a single-layer film or a multilayer film using a high-dielectric film made of, e.g., HfAlO, AlO, HfSiO, or ZrSiO.

The control gate electrode 6 is formed to cover the top face and the side surface in the channel width direction of the floating gate electrode 3 through the inter-gate insulating film 5.

Further, a surface of the STI insulating film 8 covers a lower part of the side surface of the floating gate electrode 3.

As explained above, in order to increase the dimension W1 of the floating gate electrode 3 in the channel width direction beyond the dimension W2 of the channel width, using the method of forming the thermal oxide film 7 which sets back the channel region on the side surface of the semiconductor substrate 1 serving as the channel region in the channel width direction can prevent the end of the floating gate electrode 3 from sagging toward the substrate side.

Therefore, it is possible to avoid degradation in characteristics of the memory cell transistor due to a parasitic transistor which occurs at the channel end.

Furthermore, the gate insulating film (the tunnel oxide film) 2 does not have a convex structure with respect to the floating gate electrode 3 due to this sag. Accordingly, an FN tunneling current in a writing/erasing operation is not concentrated on the gate end, thereby avoiding degradation in the gate insulating film (the tunnel oxide film) 2.

Moreover, in the structure according to this embodiment, since the dimension W2 of the channel width is narrowed, the control gate electrode 6 is apart from the channel region in the self-alignment manner.

Therefore, when a potential at the control gate electrode 6 becomes higher than a potential at the floating gate electrode 3 like a data reading operation, the potential at the control gate electrode 6 does not affect an electric field at the channel end.

Accordingly, read disturbing characteristics and retention characteristics of the memory cell transistor can be suppressed from being degraded.

A film thickness of the thermal oxide film 7 required to obtain the above-explained effect will now be described.

The anti-oxidation film 4 must be formed with a film thickness of at least 5 nm in order to prevent the oxidant from being diffused in the floating gate electrode 3.

At this time, the thermal oxide film 7 must be further formed in the semiconductor substrate 1 by an amount corresponding to a dimension A depicted in FIG. 2 in addition to 5 nm which is the film thickness of the anti-oxidation film 4. As this dimension A, at least 4 nm is required.

Moreover, when the thermal oxide film 7 is formed based on thermal diffusion of the oxidant, cubical expansion of a part to be oxidized occurs. A percentage of the film thickness of the thermal oxide film 7 formed toward the inside of the semiconductor substrate 1 based on this expansion becomes 45% of the entire film thickness of the thermal oxide film 7.

Therefore, in order to set back the channel region by an amount corresponding to the desired dimension A in the channel width direction away from the floating gate electrode 3, the thermal oxide film 7 requires a thickness of at least 20 nm.

Additionally, as shown in FIG. 4, when forming the thermal oxide film 7, a bird's beak is formed on an interface between the semiconductor substrate 1 and the gate insulating film (the tunnel oxide film) 2. When a magnitude of this bird's beak BB becomes excessive, characteristics of the memory cell transistor are degraded.

Therefore, it is desirable for the thermal oxide film 7 to have the thickness of 30 nm or below in order to provide the bird's beak BB with a magnitude which does not adversely affect operations of the memory cell. At this time, the anti-oxidation film 4 requires the film thickness of at least 10 nm.

Therefore, it is desirable for the thermal oxide film 7 to have the film thickness of 20 nm or above and 30 nm or below.

A manufacturing method of the memory cell transistor having the above-explained structure will now be described in detail.

(b) Manufacturing Method

A manufacturing method of the memory cell transistor according to this embodiment will now be explained with reference to FIGS. 5 to 13.

First, the surface of the semiconductor substrate 1 is oxidized based on, e.g., a thermal oxidation method, and then well/channel implantation is carried out with respect to the semiconductor substrate 1 based on, e.g., an ion implantation method.

Figure 5:
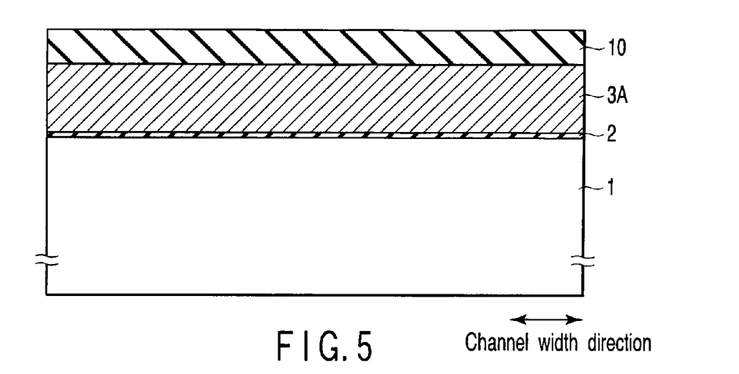
FIG. 5 is a view showing a step in a manufacturing process of a memory cell transistor according to the embodiment.

Subsequently, the oxide film on the surface of the semiconductor substrate 1 is removed, and then the gate insulating film 2 is formed based on, e.g., the thermal oxidation method as shown in FIG. 5. Thereafter, a polysilicon film 3A serving as the floating gate electrode is formed on the gate insulating film 2 based on, e.g., the chemical vapor deposition (CVD) method. Then, for example, an SiN film 10 serving as a mask material is formed on the polysilicon film 3 based on, e.g., the CVD method.

Figure 6:
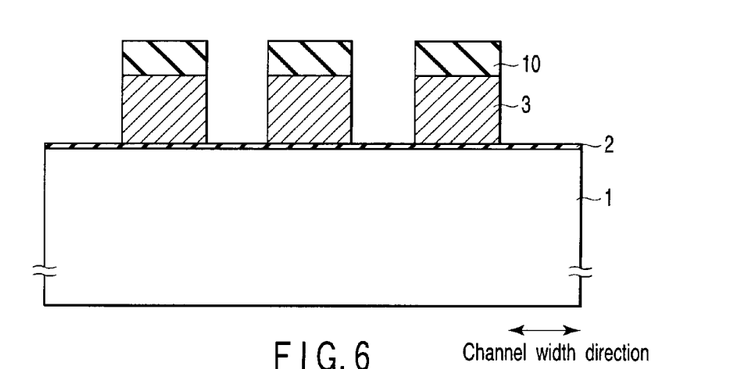
FIG. 6 is a view showing a step in the manufacturing process of the memory cell transistor according to the embodiment.

Subsequently, the SiN film 10 and the polysilicon film 3A are patterned, thereby forming the floating gate electrode 3 as shown in FIG. 6.

Figure 7:
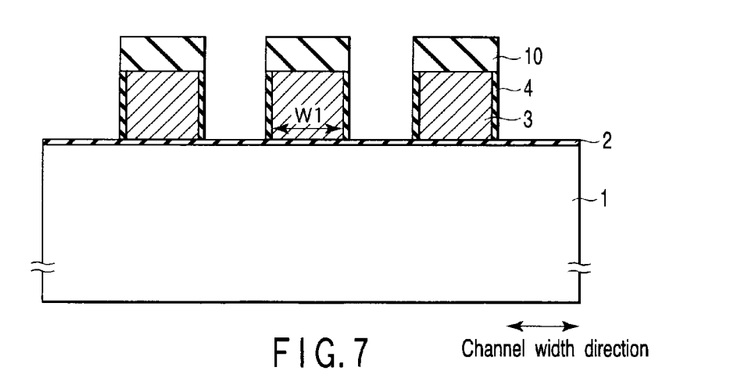
FIG. 7 is a view showing a step in the manufacturing process of the memory cell transistor according to the embodiment.

Thereafter, the entire surface of the semiconductor substrate 1 is nitrided based on, e.g., a thermal nitriding method. Then, as shown in FIG. 7, the SiN film 4 serving as the anti-oxidation film is formed on the side surface of the floating gate electrode 3 in the channel width direction. At this time, the SiN film 4 is formed to have a film thickness of, e.g., 5 to 10 nm, and a dimension of the floating gate electrode 3 in the channel width direction becomes W1.

Figure 8:
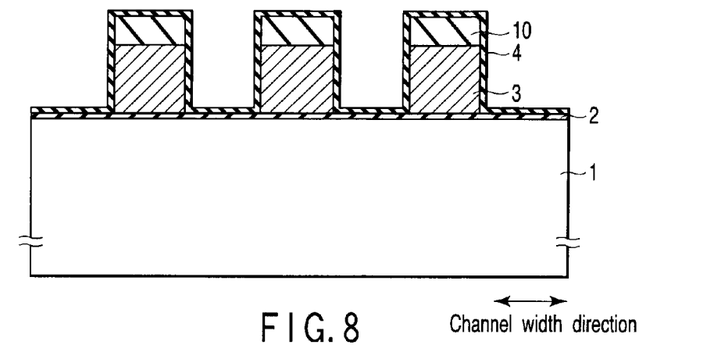
FIG. 8 is a view showing a step in the manufacturing process of the memory cell transistor according to the embodiment.

It is to be noted that the SiN film 4 may be formed to cover the entire surface based on, e.g., the CVD method as shown in FIG. 8.

Figure 9:
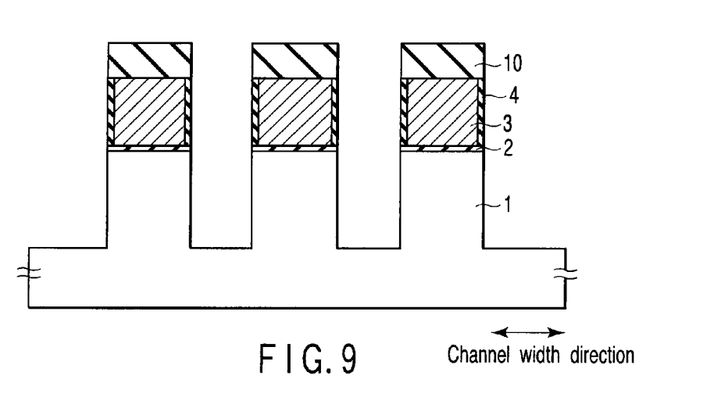
FIG. 9 is a view showing a step in the manufacturing process of the memory cell transistor according to the embodiment.

Subsequently, as shown in FIG. 9, the SiN film 10 which is the mask material is used as a mask to form the element isolation trench having the STI structure in the semiconductor substrate 1 based on, e.g., a Reactive Ion Etching (RIE) method.

At this time, a dimension of the channel width is equal to a sum of the dimension W1 of the floating gate electrode 3 in the channel width direction and the SiN film 4 which is the anti-oxidation film.

Figure 10:
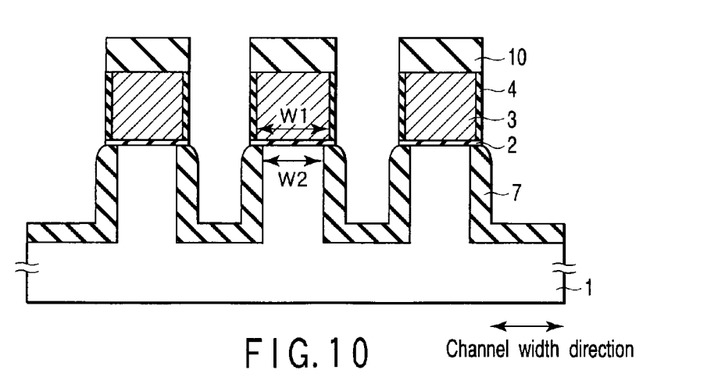
FIG. 10 is a view showing a step in the manufacturing process of the memory cell transistor according to the embodiment.

Subsequently, the entire surface of the semiconductor substrate 1 is subjected to, e.g., thermal oxidation. Then, as shown in FIG. 10, the thermal oxide film 7 is formed on a bottom surface and a side surface of the element isolation trench formed in the semiconductor substrate 1. Conditions of this thermal oxidation are conditions allowing the thermal oxide film 7 to be formed with a film thickness of 20 nm or above and 30 nm or below.

At this time, the top face of the floating gate electrode 3 is covered with the SiN film 10 serving as the mask material, and the side surface of the floating gate electrode 3 is covered with the SiN film 4 serving as the anti-oxidation film.

Therefore, the oxidant is not diffused with respect to the floating gate electrode 3, and the floating gate electrode 3 does not vary. On the other hand, the oxidant is diffused in the semiconductor substrate 1, thereby forming the thermal oxide film 7.

Therefore, when the thermal oxide film 7 is formed based on diffusion of the oxidant, the semiconductor substrate 1 serving as the channel region of the memory cell transistor is set back in the channel width direction. On the other hand, since the side surface of the floating gate electrode 3 is covered with the SiN film 4 as the anti-oxidation film and the top face of the same is covered with the SiN film 10 as the mask material, the oxidant is not diffused, and the thermal oxide film does not provoke setback of the floating gate electrode 3.

Therefore, the dimension W1 of the floating gate electrode 3 in the channel width direction becomes larger than the dimension W2 of the channel width.

Figure 11:
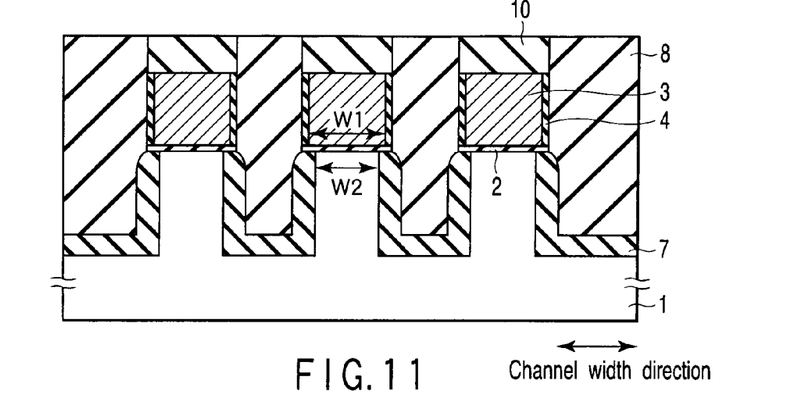
FIG. 11 is a view showing a step in the manufacturing process of the memory cell transistor according to the embodiment.

Thereafter, as shown in FIG. 11, the STI insulating film 8 made of, e.g., a silicon oxide is formed on the entire surface of the semiconductor substrate 1 based on, e.g., the CVD method in such a manner that the STI insulating film 8 is buried in the element isolation trench, and then the SiN film 10 is used as a stopper film to flatten the surface based on, e.g., the chemical mechanical polishing (CMP) method.

Figure 12:
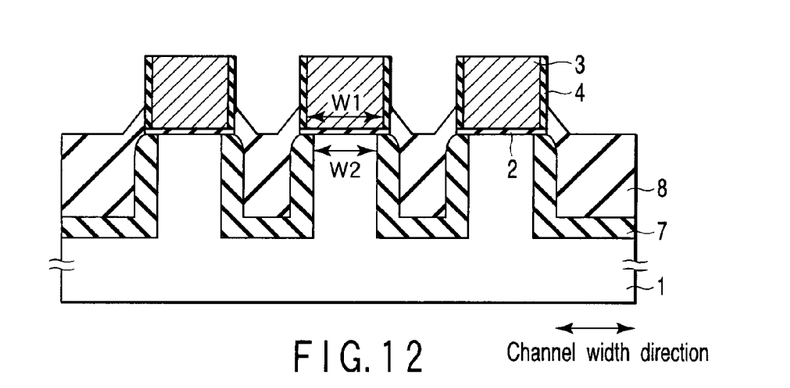
FIG. 12 is a view showing a step in the manufacturing process of the memory cell transistor according to the embodiment.

After removing the SiN film 10, when the STI insulating film 8 is etched based on, e.g., the RIE method in such a manner that a part of the side surface of the floating gate electrode is exposed, a structure depicted in FIG. 12 can be obtained.

Figure 13:
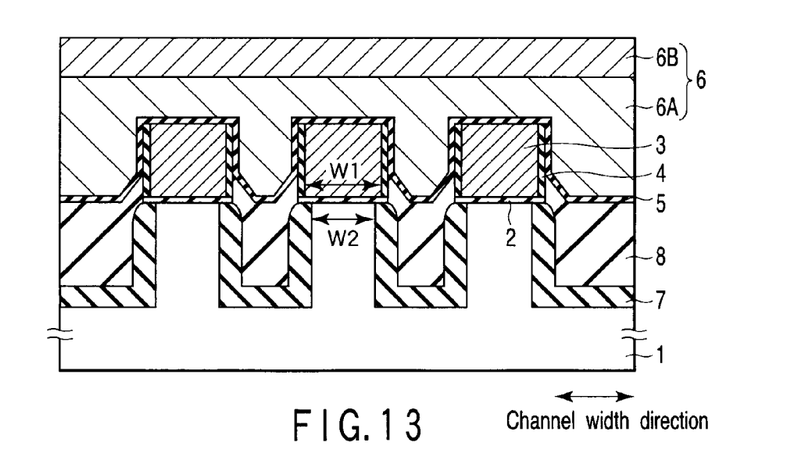
FIG. 13 is a view showing a step in the manufacturing process of the memory cell transistor according to the embodiment.

Subsequently, as shown in FIG. 13, the ONO film 5 serving as the inter-gate insulating film is formed to cover the top face and the side surface in the channel width direction of the floating gate electrode 3 based on, e.g., the CVD method. Then, for example, the polysilicon film 6A is formed on the ONO film 5 based on, e.g., the CVD method. Further, for example, a WSi film is formed on the polysilicon film 6A by using, e.g., a sputtering method, and thereafter a heat treatment are carried out. Then, the control gate electrode 6 constituted of the polysilicon film 6A and the silicide film 6B is formed.

Subsequently, the gate electrode of the memory cell transistor is formed to have a desired channel length based on the RIE method, and then a diffusion layer (not shown) functioning as a source/drain region is formed in the semiconductor substrate 1 in the self-alignment manner by using the gate electrode of the memory cell transistor as a mask based on, e.g., the ion implantation method.

With the above-explained steps, the memory cell transistor according to this embodiment is brought to completion.

It is to be noted that the SiN film 4 serving as the anti-oxidation film may be removed after the thermal oxidation step for a reduction in the channel width. At this time, the side surface of the floating gate electrode 3 in the channel width direction is covered with the inter-gate insulating film 5 formed at a later step without interposing the anti-oxidation film therebetween.

Based on the above-explained manufacturing method, it is possible to manufacture the memory cell transistor having a structure in which the dimension W1 of the floating gate electrode 3 is more than the dimension W2 of the channel width to prevent the end of the floating gate electrode 3 from sagging toward the substrate side.

Therefore, it is possible to manufacture the memory cell transistor which can avoid degradation in characteristics of the memory cell transistor due to a parasitic transistor produced at the channel end.

Furthermore, the gate insulating film (the tunnel oxide film) 2 does not have a convex structure with respect to the floating gate electrode 3 due to sag of the gate end. Therefore, an FN tunneling current in a writing/erasing operation is not concentrated on the gate end, thereby manufacturing the memory cell transistor which can avoid degradation in the gate insulating film (the tunnel oxide film) 2.

Moreover, in the above-explained manufacturing method, since the dimension W2 of the channel width is narrowed, the memory cell transistor having the structure where the control gate electrode 6 is apart from the channel region in the self-alignment manner can be manufactured.

Therefore, according to the memory cell transistor manufactured based on the above-explained manufacturing method, a potential at the control gate electrode 6 does not affect an electric field at the channel end even when the potential at the control gate electrode 6 is higher than a potential at the floating gate electrode 3 like a data reading operation. Accordingly, it is possible to manufacture the memory cell transistor which can suppress read disturbing characteristics and retention characteristics from being degraded.

Additionally, the manufacturing method does not have to complicate the manufacturing steps and can obtain the memory cell transistor having a desired structure without greatly increasing the number of manufacturing steps.

3. Others

According to the example of the present invention, it is possible to suppress a parasitic element from being produced at the channel end of the memory cell transistor.

The memory cell transistor according to the example of the present invention can be applied to, e.g., a NAND-type flash memory or a NOR-type flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a semiconductor substrate;
first and second isolation insulating layers provided in the semiconductor substrate;
a channel region between the first and second isolation insulating layers;
a gate insulating film on the channel region;
a floating gate electrode on the gate insulating film;
anti-oxide films covering whole side surfaces of the floating gate electrode in a channel width direction, the anti-oxide film being continuous on the side surface of the floating gate electrode;
an inter-gate insulating film on a top surface of the floating gate electrode and on the anti-oxide film; and
a control gate electrode on the inter-gate insulating film,
wherein the first and second isolation insulating layers is made of a thermal oxide film provided on a bottom surface and a side surface of a concave portion of the semiconductor substrate and an insulating film which is provided on the thermal oxide film and fills the concave portion,
a dimension of the floating gate electrode in a channel width direction is wider than a dimension of the channel width,
a dimension of the gate insulating film in the channel width direction is wider than maximum dimension of the floating gate electrode in a channel width direction, and
the dimension of the gate insulating film in the channel width direction is wider than the dimension of the channel width.

2. The nonvolatile semiconductor memory according to claim 1, wherein the inter-gate insulating film and the control gate electrode cover a side surface of the floating gate electrode in the channel width direction.

3. The nonvolatile semiconductor memory according to claim 1, wherein the inter-gate insulating film and the control gate control electrode cover the side surface of the floating gate electrode via the anti oxide films in the channel width direction, and a surface of the insulating film rises near the side surface of the floating gate electrode to cover a lower part of the side surface of the floating gate electrode via the anti oxide films.

4. The nonvolatile semiconductor memory according to claim 1, wherein a film thickness of the thermal oxide film is between 20 nm and 30 nm.

5. The nonvolatile semiconductor memory according to claim 1, wherein a film thickness of the anti-oxidation film is between 5 nm and 10 nm.

6. The nonvolatile semiconductor memory according to claim 1, wherein the first and second isolation insulating layers have an STI structure.

7. The nonvolatile semiconductor memory according to claim 1, wherein the control gate electrode is constituted of a polysilicon film arranged on the inter-gate insulating film and a silicide film arranged on the polysilicon film.

8. The nonvolatile semiconductor memory according to claim 1, wherein the thermal oxide film is a silicon oxide film.

9. The nonvolatile semiconductor memory according to claim 1, wherein the insulating film is a silicon oxide film.

10. The nonvolatile semiconductor memory according to claim 2, wherein the anti-oxidation film is a silicon nitride film.

11. The nonvolatile semiconductor memory according to claim 1, wherein the floating gate electrode is a polysilicon film.

12. The nonvolatile semiconductor memory according to claim 1, wherein the inter-gate insulating film is an ONO film.

13. The nonvolatile semiconductor memory according to claim 1, wherein the inter-gate insulating film includes a high-dielectric film.

14. The nonvolatile semiconductor memory according to claim 1, wherein the thermal oxide film is formed by thermally diffusing an oxidant in a side surface of the channel region in the semiconductor substrate in a channel width direction.

15. A method of manufacturing the nonvolatile semiconductor memory according to claim 1, comprising:
forming the gate insulating film formed on the surface of the semiconductor substrate;
forming the floating gate electrode on the gate insulating film;
forming the anti-oxidation film on the whole side surfaces of the floating gate electrode in the channel width direction;
using the floating gate electrode as a mask to form the concave portion in the semiconductor substrate;
forming the thermal oxide film on the bottom surface and the side surface of the concave portion;
forming the insulating film on the thermal oxide film to fill the concave portion;
forming the inter-gate insulating film on the floating gate electrode; and
forming the control gate electrode on the inter-gate insulating film.

16. The method of manufacturing a nonvolatile semiconductor memory according to claim 15, wherein the thermal oxide film is formed by thermally diffusing an oxidant in the side surface of the channel region in the semiconductor substrate in the channel width direction.

17. The method of manufacturing a nonvolatile semiconductor memory according to claim 15, wherein the anti-oxidation film is formed based on a thermal nitriding method.

18. The method of manufacturing a nonvolatile semiconductor memory according to claim 15, wherein the anti-oxidation film is formed based on a CVD method.

19. The method of manufacturing a nonvolatile semiconductor memory according to claim 15, wherein the control gate electrode is formed by a heat treatment of a polysilicon film formed on the inter-gate insulating film and a metal film formed on the polysilicon film.

* * * * *